(12) United States Patent
Lehmann et al.

(10) Patent No.: US 6,426,911 B1
(45) Date of Patent: Jul. 30, 2002

(54) AREA EFFICIENT METHOD FOR PROGRAMMING ELECTRICAL FUSES

(75) Inventors: Gunther Lehmann, Poughkeepsie; Gabriel Daniel, Jamaica Estates, both of NY (US); Gerd Frankowsky, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 09/691,953

(22) Filed: Oct. 19, 2000

(51) Int. Cl.[7] ............................................. G11C 7/00
(52) U.S. Cl. ................................... 365/225.7; 365/200
(58) Field of Search .............................. 365/225.7, 200

(56) References Cited

U.S. PATENT DOCUMENTS

| | | | | |
|---|---|---|---|---|
| 5,313,424 A | * | 5/1994 | Adams et al. ............... | 365/200 |
| 5,621,691 A | * | 4/1997 | Park ........................... | 365/200 |
| 5,859,801 A | | 1/1999 | Poechmueller .............. | 365/200 |
| 5,933,376 A | * | 8/1999 | Lee ............................. | 365/200 |
| 5,966,333 A | * | 10/1999 | Otani et al. ................. | 365/200 |
| 6,008,523 A | | 12/1999 | Narayan et al. ............ | 257/529 |
| 6,205,063 B1 | * | 3/2001 | Aipperspach et al. ....... | 365/200 |

* cited by examiner

*Primary Examiner*—Trong Phan

(57) ABSTRACT

A circuit for programming electrical fuses, in accordance with the present invention, includes a shift register including a plurality of latches. Each latch has a corresponding switch and a corresponding electrical fuse. A bit generator generates a single bit of a first state and all other bits of a second state. The bit generator propagates the generated bits into the shift register in accordance with a clock signal. Each switch enables conduction through the corresponding electrical fuse in accordance with the generated bits stored in the corresponding latch. A blow voltage line connects to the electrical fuses. The blow voltage line is activated to blow fuses in accordance with programming data such that the electrical fuses are programmed in accordance with the programming data when the single bit of the first state is stored in the latch corresponding to the fuse to be programmed.

22 Claims, 5 Drawing Sheets

AREA EFFICIENT METHOD FOR PROGRAMMING ELECTRICAL FUSES

BACKGROUND

1. Technical Field

This disclosure relates to semiconductor devices and more particularly, to an area efficient fuse register that provides electrical programming of on-chip fuses.

2. Description of the Related Art

Memory devices, such as dynamic random access memory devices (DRAM) typically include fuse circuits. Fuses included in these fuse circuits may be employed to activate redundant elements which replace failing cells or components. Fuses may be grouped into two classes, for example, laser fuses and electrical fuses. Laser fuses are blown by a chip-external laser beam which irradiates specific fuses to supply enough energy to blow the fuse. Electrically blowable fuses are blown when a current through the fuses exceeds a threshold causing energy build up to blow the fuse.

One of the major differences between laser fuses and electrical fuses is the way they are addressed (or accessed) in order to blow them. For laser fuses, the laser beam is simply pointed to fuses which are to be blown (i.e., Aaddressing by location@). Contrary to this, electrical fuses must be blown by accessing pins of the chip.

It is desirable for electrical fuses to play an increasing role in higher density memory devices. Considering the large number of fuses typically found on DRAM circuits, the selection of an electrical fuse that should be blown either requires a large amount of decoder circuitry or many address wires on chip, if standard decoding schemes are applied.

Therefore, a need exists for an apparatus which reduces the area overhead caused by the necessity to address electrical fuses on chip.

SUMMARY OF THE INVENTION

A circuit for programming electrical fuses, in accordance with the present invention, includes a shift register including a plurality of latches. Each latch has a corresponding switch and a corresponding electrical fuse. A bit generator generates a single bit of a first state and all other bits of a second state. The bit generator propagates the generated bits into the shift register in accordance with a clock signal. Each switch enables conduction through the corresponding electrical fuse in accordance with the generated bits stored in the corresponding latch. A blow voltage line connects to the electrical fuses. The blow voltage line is activated to blow fuses in accordance with programming data such that the electrical fuses are programmed in accordance with the programming data when the single bit of the first state is stored in the latch corresponding to the fuse to be programmed.

In other embodiments, the register may include a shift register and the programming information may be shifted into the shift register. The programming information may be shifted into the shift register in accordance with cycles of a clock signal. The activation event may occur when, the number of clock cycles of the programming information shifted into the shift register equals the number of latches. The programming information may include digital bits and the switch may include a transistor. The switch preferably enables conduction from the blow voltage line to ground through the electrical fuse. The activation event may also occur when the register is full. The circuit may be included in a memory device and the programming information may include results of a redundancy calculation.

Another circuit for programming electrical fuses, in accordance with the present invention, includes a shift register including a plurality of latches, each latch having a corresponding switch and a corresponding electrical fuse. A bit generator generates a single bit of a first state and all other bits of a second state. The bit generator propagates the generated bits into the shift register in accordance with a clock signal. Each switch enables conduction through the corresponding electrical fuse in accordance with the generated bits stored in the corresponding latch. A blow voltage line connects to the electrical fuses, and the blow voltage line is activated to blow fuses in accordance with programming data such that the electrical fuses are programmed in accordance with the programming data when the single bit of the first state is stored in the latch corresponding to the fuse to be programmed.

A fuse latch circuit for programming electrical fuses, in accordance with the present invention, includes a shift register including a plurality of latches, each latch having a corresponding switch and a corresponding electrical fuse, each latch including a serial connection for transferring digital information to an adjacent latch. A bit generator generates a single bit of a first state and all other bits of a second state, and the bit generator propagates the generated bits into the shift register in accordance with a clock signal. Each switch includes a blow transistor having a gate connected to the serial connection for enabling conduction through the corresponding electrical fuse in accordance with the generated bits stored in the corresponding latch. A blow voltage line connects to the electrical fuses, and the blow voltage line is activated to blow fuses in accordance with ordered programming data stored in a memory storage device such that the electrical fuses are programmed in accordance with the ordered programming data when the single bit of the first state is stored in the latch corresponding to the fuse to be programmed. A clock is coupled to the shift register, the bit generator and the memory storage device for providing the clock signal to synchronize the programming data and the generated bits to address the fuses to be programmed.

In other embodiments, the blow voltage line may be enabled by a transistor, and the programming data may be applied to the transistor in accordance with the clock signal. The generated bits are preferably propagated through the shift register in accordance with the clock signal. The switch preferably includes a transistor, and the switch preferably enables conduction from the blow voltage line to ground through the electrical fuse. The circuit may be included in a memory device and the programming data includes results of a redundancy calculation.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes an apparatus and method for blowing electrical fuses according to existing programming information, for example, fuse programming data derived from a preceding redundancy analysis for a memory device. The present invention may be based on a standard memory device, such as, for example, a DRAM implementation, where each fuse is connected to a fuse latch which carries the fuse information during normal chip operation. In accordance with the present invention, an area efficient fuse circuit is presented which programs fuses in accordance with fuse data by selectively applying a voltage capable of electrically blowing the designated fuses.

Figure 1:
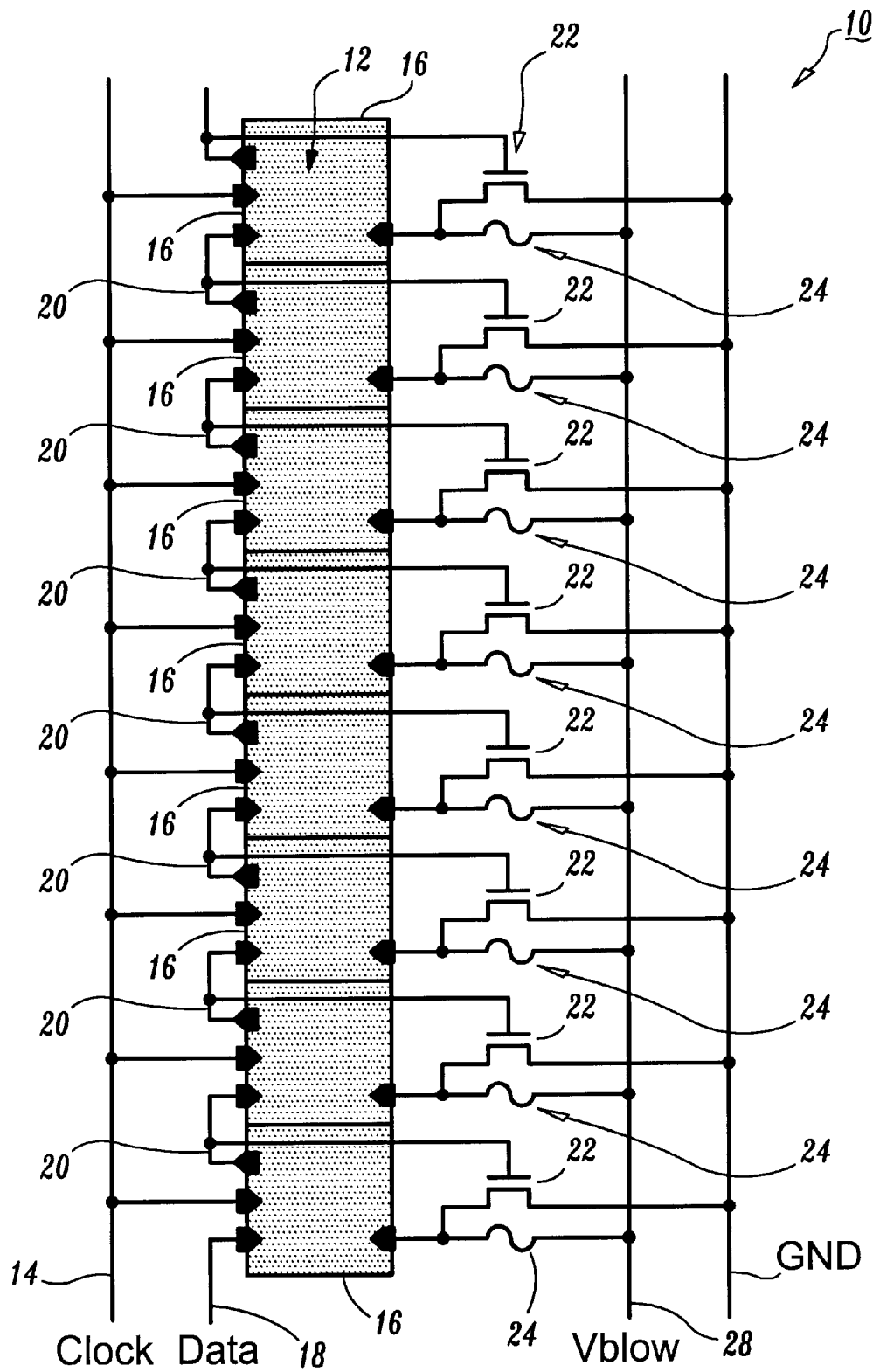
FIG. 1 is a schematic diagram showing an illustrative fuse latch register for programming electrical fuses in accordance with the present invention.

Referring now in specific detail to the drawings in which like reference numerals identify similar or identical elements throughout the several views, and initially to FIG. 1, one embodiment of the present invention is schematically depicted. A fuse latch circuit 10 includes a fuse latch register 12, preferably a shift register, for storing fuse data employed to program fuses in accordance with the invention. Register 12 shifts data in accordance with a clock signal (Clock) on clock line 14. Clock line 14 enables each latch 16 of register 12 to transfer data between latches 16. Data initially enters register 12 at a first latch through a data line 18 (Data). Data is passed through latches by employing a serial in/serial out line 20 which connects each latch 16.

A blow transistor 22 is included for each latch 16. Blow transistors 22 include a drain connected to ground (GND) and a source connected through a fuse 24 to a blow voltage line 28 (Vblow). A gate of each transistor 22 is connected to the serial in/serial out line 20 between each latch. Contrary to a conventional decoding scheme where the blow transistors are activated independently of the status of the fuse latches, the present invention advantageously employs shift register 12 and serial in/serial out wiring 20 between the fuse latches 16, which connects to the gates of the blow transistors 22 to the serial output 20 of each fuse latch 16.

The Clock signal is used to propagate the programming information from the Data input 18 into the fuse latch shift register 12. At a point in time when the input data in each latch is at its designated location, Vblow line 28 is activated with a voltage capable of blowing enabled fuses 24. In this case, NFET transistors 22 are enabled by a high or logic "1" data bit. Other device types may also be employed. An electrical fuse is blown if a fuse latch is set to "1" and the blow voltage (Vblow) is turned on. Opposite polarities are also contemplated, for example, a logic "0" may be employed to activate a PFET transistor employed as transistors 22.

Figure 2:
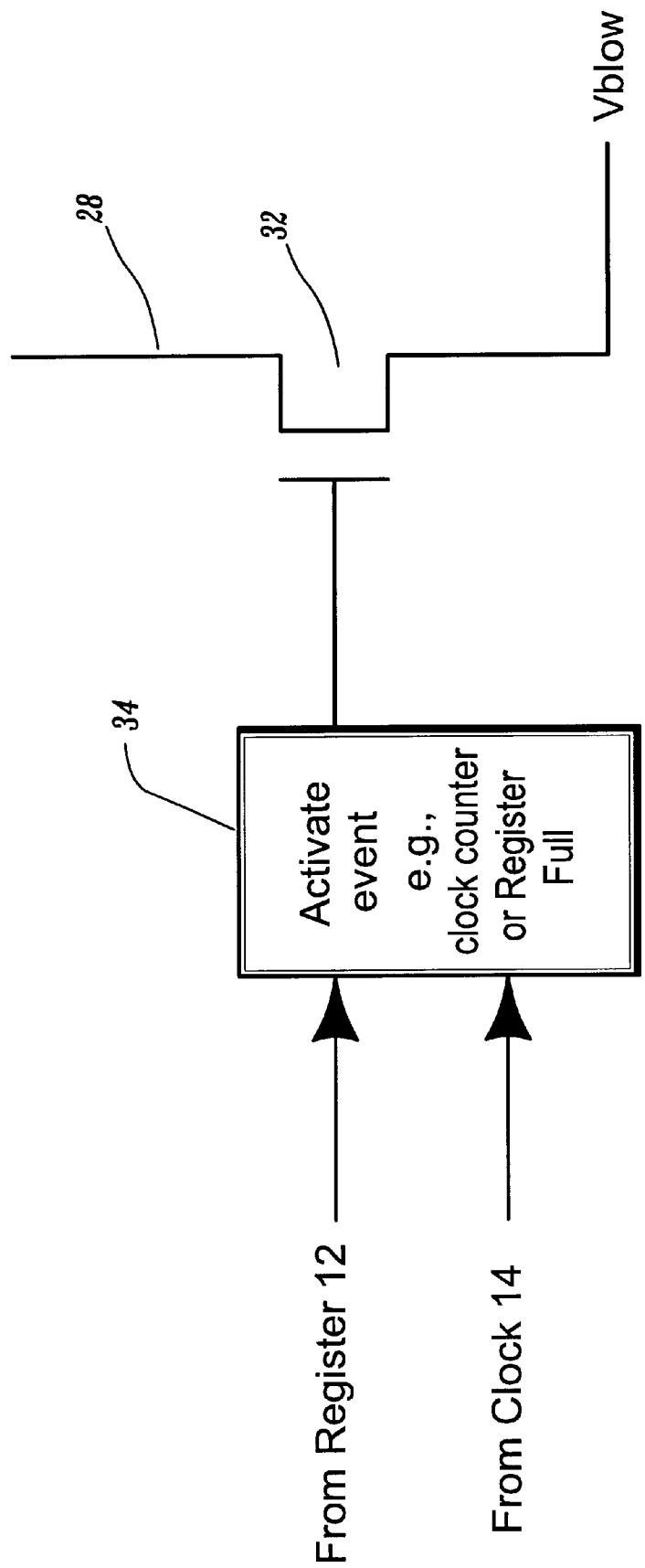
FIG. 2 is a schematic diagram showing an illustrative circuit for activating a blow voltage line for programming electrical fuses in accordance with the present invention.

Referring to FIG. 2, an illustrative circuit is shown for activation of a Vblow line 28. In this illustrative embodiment, Vblow line 28 is activated when an activation event occurs, for example, when fuse latch register 12 is filled or after a predetermined number N of clock cycles, for example, where N equals the number of latches. An activation circuit 34 includes logic circuitry for generating an enable signal to activate Vblow line 28. Activation circuit 34 may include a counter to count clock cycles from clock 14 or include circuitry to indicate when register 12 is full. The activation event causes an enable signal to turn Vblow line 28 on by employing, for example, a transistor 32. Other circuits may be employed as well.

In accordance with one embodiment, after all latches of the shift register are set (e.g., number of clock cycles= number of latches), a pulse on the Vblow wire 28 follows which concurrently blows all the fuses 24 activated by a "1" stored in the fuse latch 16. Vblow depends on the specific fuse technology. This disclosure is not limited to the applied fuse technology. Currently used electrical fuses provide blow voltages in the range of, for example, between 2V and 12V. The blow time per fuse may range from 1 ms to several seconds, depending on the characteristics of the fuse technology.

The embodiment described with reference to FIG. 1 may be limited by the power that can be supplied on the Vblow wire 28, especially for large shift registers and/or multiple fuses, which may be blown. This may be solved be decreasing the number of fuses serviced by Vblow line 28 at any given time. Other devices and methods may also be employed as will be described below.

Figure 3:
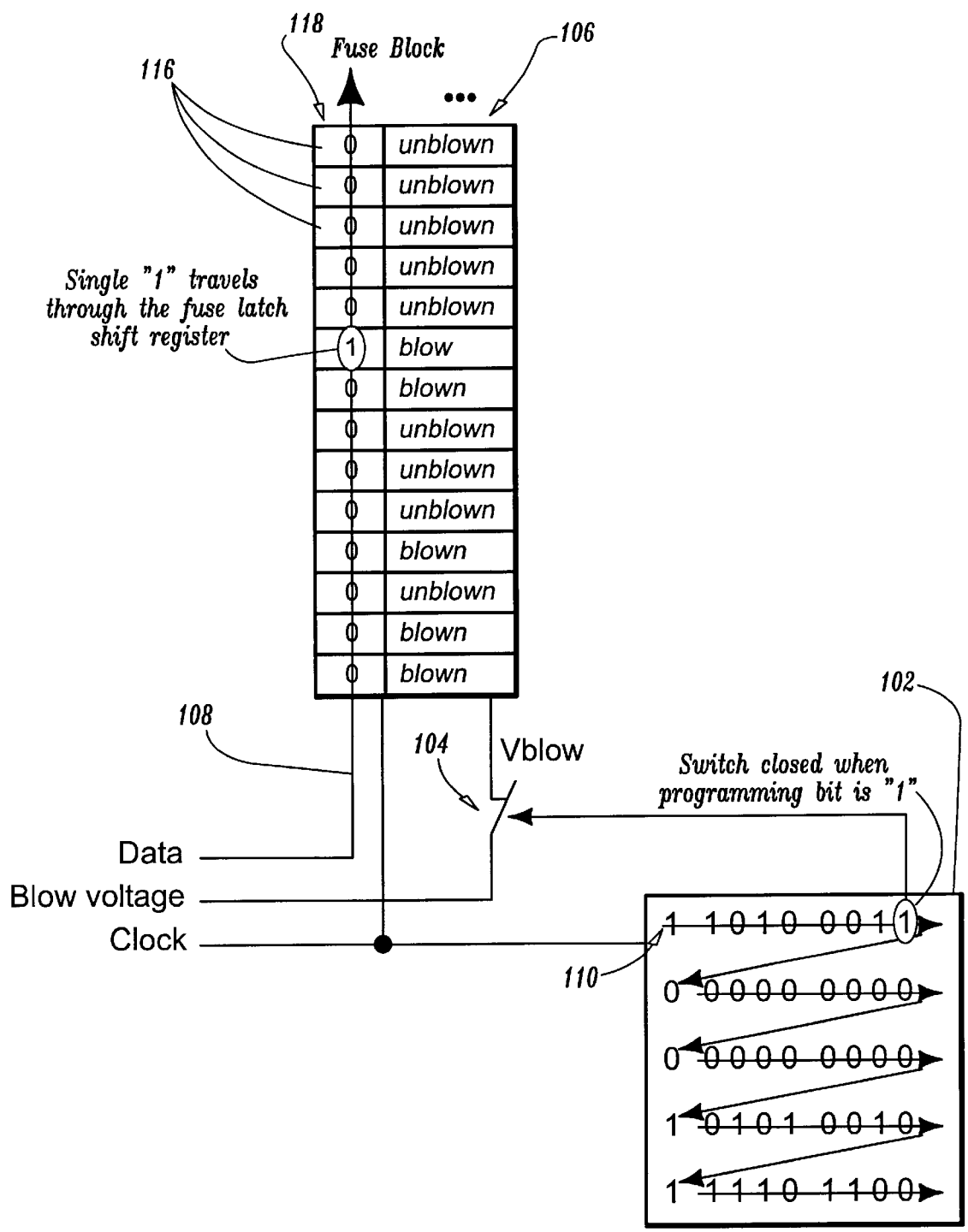
FIG. 3 is a schematic diagram showing another embodiment of a fuse latch register for programming electrical fuses in accordance with the present invention.

Referring to FIG. 3, another embodiment of the present invention is shown. Advantageously, the embodiment shown in FIG. 3 overcomes any limitation of power on the Vblow line. In this embodiment, programming information is not stored in fuse latches 116 but is used to gate a blow voltage. Fuse latches 116 are preferably employed in a shift register 118. Stored fuse programming data shown in a fuse programming table 102 for illustrative purposes is employed to enable a switch 104. Stored fuse programming data may be supplied from a memory storage device either on-chip or off-chip. Switch 104 preferably includes a field effect transistor which has a gate enabled by a logic high or "1", e.g., switch 104 is closed when the programming bit from table 102 is "1". In the embodiment shown, a fuse block 106 including fuses therein is only blown when the corresponding fuse latch stores a "1" and Vblow is turned on by switch 104.

To propagate the programming information of table 102, a single "1" bit followed by "0"s is clocked by a Clock Signal into data input 108. In parallel, the programming information is read using same Clock signal. The propagated single A1" acts as a pointer activating only one fuse latch per clock cycle. Advantageously, not more than one fuse is blown per clock cycle. This reduces the power requirements for the Vblow wire without increasing the number of clocks for propagating the programming information.

As shown in FIG. 3, a first row 110 of data in table 102 illustratively includes the data sequence 110100011. This sequence corresponds to the fuse status in fuse block 106, for example, from the bottom, the status of the fuses are blown, blown, unblown, blown, unblown, unblown, unblown, blown and blow. The fuse with the status shown as "blow" is being blown by having the programming data equal to "1" from table 102 and currently has a "1" bit stored in the fuse latch of the shift register.

Figure 4:
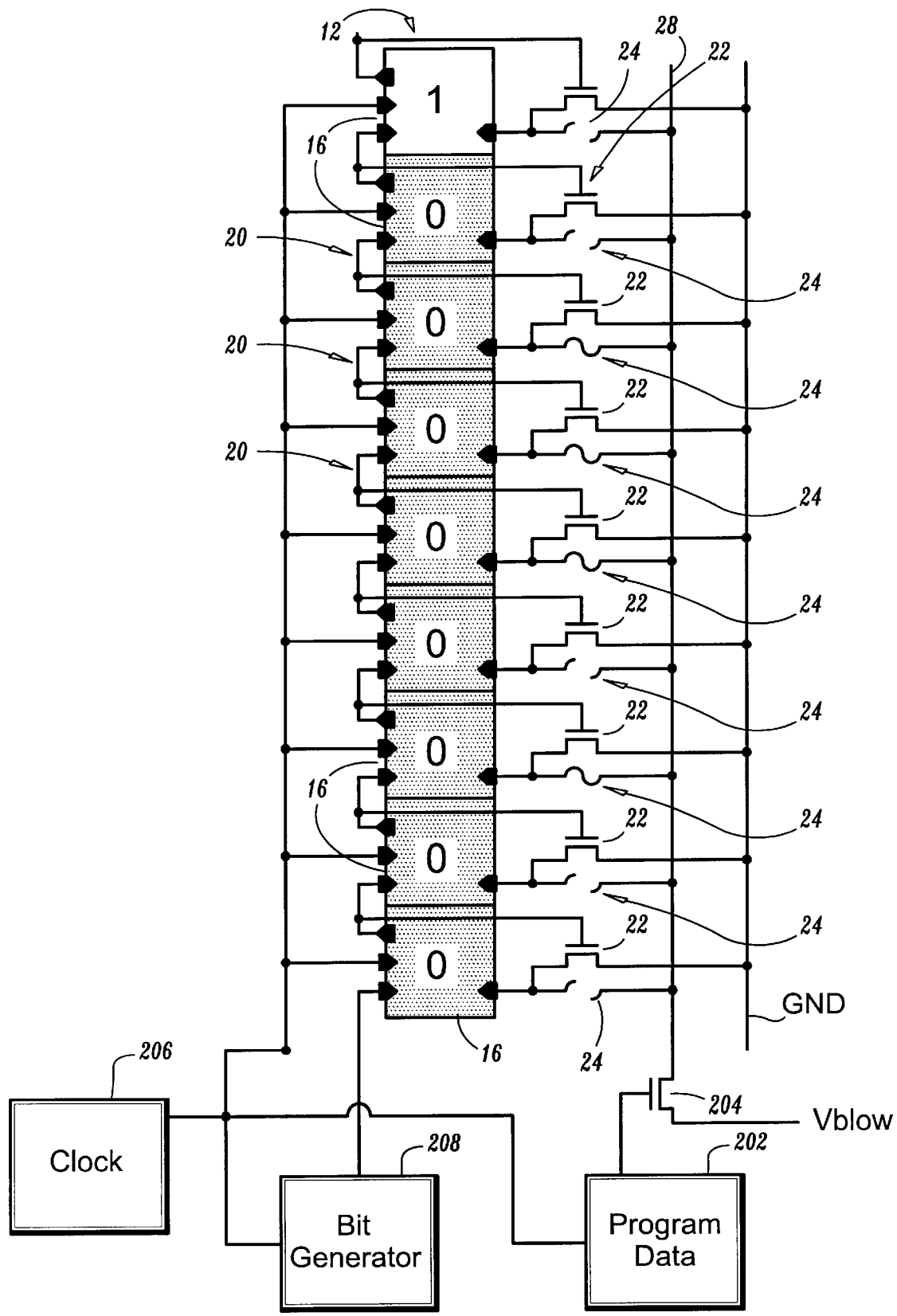
FIG. 4 is a schematic diagram showing an illustrative circuit for implementing the example in FIG. 3 in accordance with the present invention.

Referring to FIG. 4, a schematic diagram of the embodiment described with reference to FIG. 3 is illustratively shown. Program data 202 may be a data stream or stored in a memory unit which may be on-chip or off-chip. For example, program data 202 may include redundancy data stored in a memory test device during a redundancy calculation. Program data 202 includes an order which provides appropriate addressing for programming fuses 24. Program data 202 is input to a gate of a transistor 204, and program data 202 is read in order at each cycle of clock 206 and applied to the gate of transistor 204. A bit generator 208 is employed to generate a single "1" bit and all other bits generated are "0"s. A single "1" is entered into a fuse latch shift register 12. As the "1" passes through each latch 16 of register 12, each transistor 22 is enabled during a clock cycle when the "1" is stored in that latch. If during that clock cycle Vblow is enabled by program data 202 (e.g., a "1" applied to the gate of transistor 204) and the "1" is present in the corresponding latch, the respective fuse 24 is blown. Status of fuses 24 are indicated as blown or unblown in accordance with the program data of the first row 110 of FIG. 3.

By the present invention, an area efficient fuse latch layout is achieved. The area efficiency results from at least two major improvements over current implementations. First, the addressing of the fuses is simplified by using a shift register instead of specific address wires and address decoders. Second, the fuse latch (which is reading and storing the state of the fuse) and the shift register advantageously share circuit elements, as described with reference to FIG. 5 below.

The present invention is particularly useful as integrated circuits in semiconductor memory devices, for example, for DRAM devices including a large number of electrical fuses, which have to be addressed in an area efficient way. As an illustration, the table 102 of FIG. 3 may be viewed as the programming information of a column redundancy. Each row of the table may represent one redundant element whereas the left-most column element keeps master fuse information, e.g. for an entire segment or block of memory, for example. The remaining columns may represent column addresses that have to be programmed.

Additionally, the present invention eases integration with on-chip DRAM self-repair which is controlled by, for example, a BIST (Built In Self Test) circuit. In this case, the BIST may determine an efficient scheme for programming the row and column fuses and initiate the programming sequence, as described above. This may be performed automatically on-chip if redundancy calculations are performed on-chip or the programming information is readily available. The programming information may be stored in the registers of the BIST engine itself. The sharing of registers between the on-chip BIST circuit and the fuse programming circuitry advantageously overcomes any limitations of the additional area that would be required for the implementation of programming storage (e.g., storage 102) or circuitry of the prior art.

Figure 5:
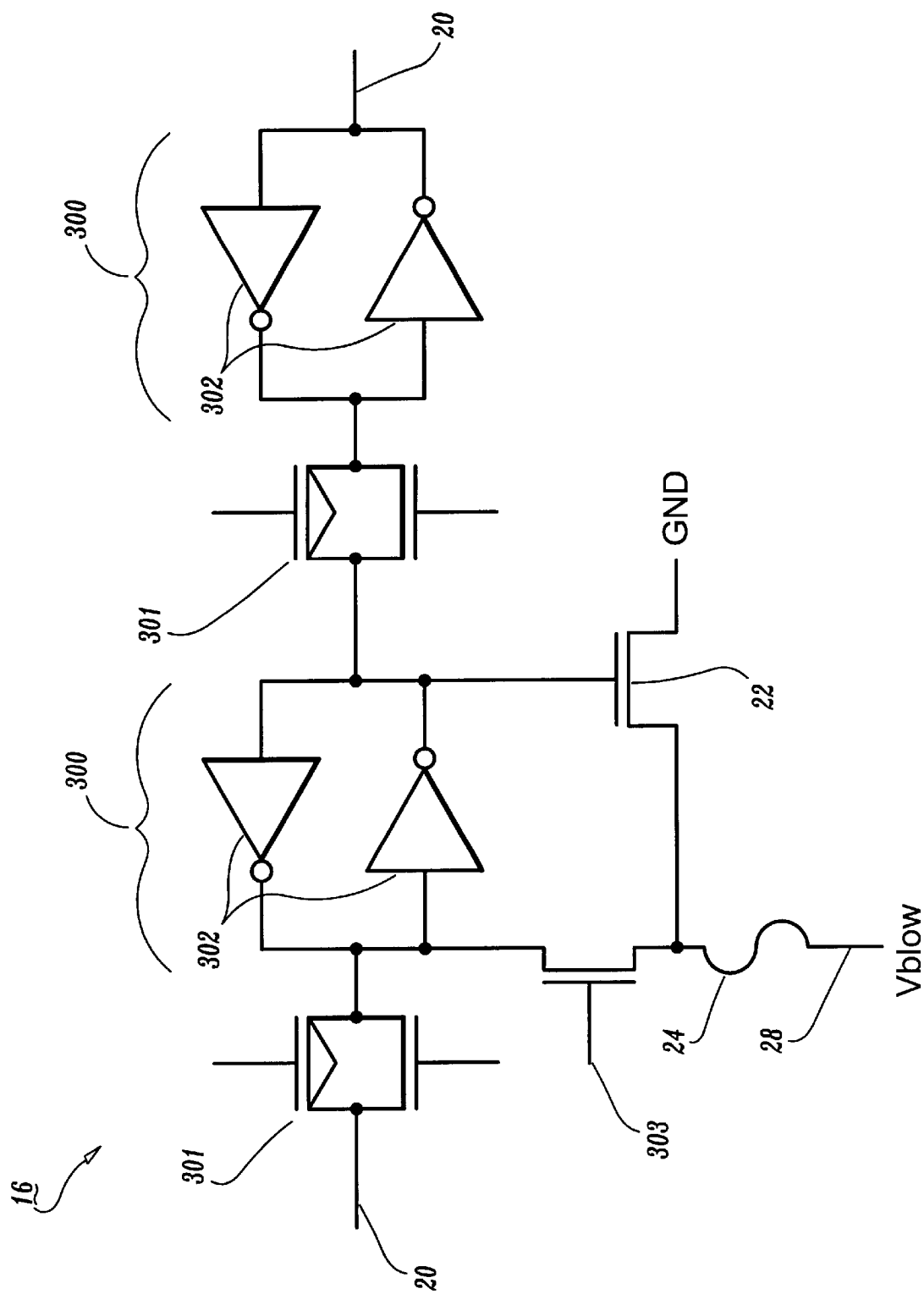
FIG. 5 is a schematic diagram showing an illustrative fuse latch/shift register combined circuit for programming electrical fuses in accordance with the present invention.

Referring to FIG. 5, one preferred implementation of the shift register latch 16 is shown. Shift register 16 functionality is realized by a combination of two transfer gates 301 and two latches 300 which each include two cross coupled inverters 302. The gates of the transistors of the transfer gates 301 are controlled by clock signals (e.g., clock 14 and an inverted clock 14). The implementation of the invention is not limited to this specific shift register realization. Other implementations may be employed and may include, for example, tristate buffers instead of the transfer gates 301 or introduce tristate buffers or transfer gates into the feedback loop to the latches 300. Variations in the implementation of the latch 300 may also be included.

The implementation shown in FIG. 5 includes an additional read out transistor 303 that connects electrical fuse 24 to one side of one of the latches 300 (e.g., left side latch in FIG. 5). The gate of the blow transistor 22 connects to the other side of the same latch (as shown in FIG. 5) or to one of the connectors of the other latch (right side latch). By controlling the gate of transistor 303, a fuse read out can be initiated by opening a conducting path between the latch 300 and the electrical fuse 24. Depending on the state of the fuse 24, the state of the latch 300 is then flipped or remains the same. In the depicted implementation, the voltage Vblow would be identical to GND during the read out process. Therefore, it would not be necessary to disconnect the blow transistor 22 through an additional device since the blow transistor 22 would actually contribute to flipping the latch 300 in case that the electrical fuse exhibits a low resistance (i.e. conducting path to Vblow).

One advantage of this implementation is that one of the two latches 300 is not only used to store one of the states during the shift operation, but also is used for reading and storing the state of the fuse 24 after the blow process is finished. This results in significant area savings since no additional fuse latches or additional devices are required other than the read out switch 303.

This preferred implementation of the combined fuse latch/shift register latch 16 provides at least the following benefits/advantages. The connection of an electrically blowable fuse element to a shift register via an electrical switch enables the reading of the state (blown/unblown) of the fuse element. The storage of the read state of the electrically blowable fuse is stored in one of the latches of the shift register. The connection of the read out switch 303 in conjunction with an additional connection of an electrical switch (e.g. blow transistor 22) enables the blowing of the electrical fuse by connecting the fuse element to a power supply line. The gate of the blow transistor 22 is preferably controlled by the state of one the latches of the shift register.

Having described preferred embodiments for area efficient method for programming electrical fuses (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A circuit for programming electrical fuses comprising:
   a register including a plurality of latches for storing fuse programming information;
   each latch having a corresponding switch and a corresponding electrical fuse, the switch for enabling conduction through the electrical fuse in accordance with the programming information stored in the corresponding latch; and
   a blow voltage line connecting to the electrical fuses, the blow voltage line being activated to blow fuses upon an activation event such that the electrical fuses are programmed in accordance with the programming information in the latches.

2. The circuit as recited in claim 1, wherein the register includes a shift register and the programming information is shifted into the shift register.

3. The circuit as recited in claim 2, wherein the programming information is shifted into the shift register in accordance with cycles of a clock signal.

4. The circuit as recited in claim 3, wherein the activation event occurs when, the number of clock cycles where programming information is shifted into the shift register equals the number of latches.

5. The circuit as recited in claim 1, wherein the programming information includes digital bits and the switch includes a transistor.

6. The circuit as recited in claim 1, wherein the switch enables conduction from the blow voltage line to ground through the electrical fuse.

7. The circuit as recited in claim 1, wherein the activation event occurs when the register is full.

8. The circuit as recited in claim 1, wherein the circuit is included in a memory device and the programming information includes results of a redundancy calculation.

9. A circuit for programming electrical fuses comprising:
   a shift register including a plurality of latches, each latch having a corresponding switch and a corresponding electrical fuse;
   a bit generator for generating a single bit of a first state and all other bits of a second state, the bit generator propagating the generated bits into the shift register in accordance with a clock signal;
   each switch for enabling conduction through the corresponding electrical fuse in accordance with the generated bits stored in the corresponding latch; and
   a blow voltage line connecting to the electrical fuses, the blow voltage line being activated to blow fuses in accordance with programming data such that the electrical fuses are programmed in accordance with the programming data when the single bit of the first state is stored in the latch corresponding to the fuse to be programmed.

10. The circuit as recited in claim 9, wherein the blow voltage line is enabled by a transistor.

11. The circuit as recited in claim 10, wherein the programming data is applied to the transistor in accordance with the clock signal.

12. The circuit as recited in claim 9, wherein the generated bits are propagated through the shift register in accordance with the clock signal.

13. The circuit as recited in claim 9, wherein the switch includes a transistor.

14. The circuit as recited in claim 9, wherein the switch enables conduction from the blow voltage line to ground through the electrical fuse.

15. The circuit as recited in claim 9, wherein the circuit is included in a memory device and the programming data includes results of a redundancy calculation.

16. A fuse latch circuit for programming electrical fuses comprising:
   a shift register including a plurality of latches, each latch having a corresponding switch and a corresponding electrical fuse, each latch including a serial connection for transferring digital information to an adjacent latch;
   a bit generator for generating a single bit of a first state and all other bits of a second state, the bit generator propagating the generated bits into the shift register in accordance with a clock signal;
   each switch including a blow transistor having a gate connected to the serial connection for enabling conduction through the corresponding electrical fuse in accordance with the generated bits stored in the corresponding latch;
   a blow voltage line connecting to the electrical fuses, the blow voltage line being activated to blow fuses in accordance with ordered programming data stored in a memory storage device such that the electrical fuses are programmed in accordance with the ordered programming data when the single bit of the first state is stored in the latch corresponding to the fuse to be programmed; and
   a clock coupled to the shift register, the bit generator and the memory storage device for providing the clock signal to synchronize the programming data and the generated bits to address the fuses to be programmed.

17. The circuit as recited in claim 16, wherein the blow voltage line is enabled by a transistor.

18. The circuit as recited in claim 17, wherein the programming data is applied to the transistor in accordance with the clock signal.

19. The circuit as recited in claim 16, wherein the generated bits are propagated through the shift register in accordance with the clock signal.

20. The circuit as recited in claim 16, wherein the switch includes a transistor.

21. The circuit as recited in claim 16, wherein the switch enables conduction from the blow voltage line to ground through the electrical fuse.

22. The circuit as recited in claim 16, wherein the circuit is included in a memory device and the programming data includes results of a redundancy calculation.

* * * * *